United States Patent
Malinowski et al.

(10) Patent No.: US 7,067,914 B2
(45) Date of Patent: Jun. 27, 2006

(54) DUAL CHIP STACK METHOD FOR ELECTRO-STATIC DISCHARGE PROTECTION OF INTEGRATED CIRCUITS

(75) Inventors: John C. Malinowski, Jericho, VT (US); Edmund J. Sprogis, Underhill, VT (US); Steven H. Voldman, So. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,027

(22) Filed: Nov. 9, 2001

(65) Prior Publication Data

US 2003/0089979 A1    May 15, 2003

(51) Int. Cl.
*H01L 23/34* (2006.01)
(52) U.S. Cl. .............. 257/723; 257/724; 257/777; 257/320; 257/203
(58) Field of Classification Search ............... 257/320, 257/203, 777–778, 676, 723
See application file for complete search history.

(56) References Cited

U.S. PATENT DOCUMENTS

| 5,610,790 | A  | * | 3/1997 | Staab et al. ............ 361/111 |
| 5,930,098 | A  |   | 7/1999 | Voldman et al. |
| 6,081,409 | A  |   | 6/2000 | Hughbanks et al. |
| 6,180,426 | B1 | * | 1/2001 | Lin .......................... 438/15 |
| 6,198,136 | B1 | * | 3/2001 | Voldman et al. ........ 257/357 |
| 6,493,198 | B1 | * | 12/2002 | Arledge et al. ........... 361/56 |

OTHER PUBLICATIONS

Wallash et al., ESD Failure Mechanisms of Inductive and Magnetoresistive Recording Heads, Electrical Overstress/Electrostatic Discharge Symposium Proceedings, 1995, Sep. 12-14, 1995, pp. 322-330.

* cited by examiner

*Primary Examiner*—Luan Thai
(74) *Attorney, Agent, or Firm*—Schmeiser, Olsen & Watts; Anthony Canale

(57) ABSTRACT

Disclosed is an electronic device comprising a semiconductor chip including an integrated circuit having at least one electrostatic discharge sensitive device and a non-semiconductor chip, positioned in close proximity to the semiconductor chip, the non-semiconductor chip having at least one electrostatic discharge protection device. The electrostatic discharge protection device is electrically connected to the electrostatic discharge sensitive device.

33 Claims, 9 Drawing Sheets

DUAL CHIP STACK METHOD FOR ELECTRO-STATIC DISCHARGE PROTECTION OF INTEGRATED CIRCUITS

BACKGROUND OF THE INVENTION

1. Field of the Invention

The present invention relates to the field of integrated circuit chips, particularly the protection of integrated circuit chips from electrostatic discharges.

2. Background of the Invention

Integrated circuits for radio frequency (RF) applications require both active and passive elements. Active elements include metal-oxide-silicon field-effect-transistors (MOSFETs) and bipolar transistors. In RF CMOS (complimentary-metal-oxide-silicon), active elements include N-channel MOSFETs and P-channel MOSFETs. In RF silicon BiCMOS (bipolar-CMOS) technology, active elements include silicon bipolar junction transistors (BJT) in addition to CMOS MOSFETs. In silicon germanium (SiGe) technology, active elements include hetro-junction bipolar transistors (HBT.) For RF circuits both passive and active elements are needed. Examples of passive elements include resistors, capacitors and inductors. In RF applications, passive elements having a high quality factor (Q) are required. High Q capacitors have minimal resistive effects. High Q resistors have low parasitic capacitance. High quality inductors have low series resistance and minimal capacitive coupling to the chip substrate.

Typically, high Q passive resistors, capacitors and inductors are placed away from the semiconductor substrate. Inductors, especially, are placed above the chip interconnect metallurgy to minimize capacitive and inductive coupling to the semiconductor substrate. Inductors are formed from the same materials and processes as used to form the interconnect metallurgy. When a circuit using inductors is required, thick interlevel insulating films and deep vias are used. However, as CMOS interconnect metallurgy scales (linewidth and line thickness decrease) inductor-substrate distance decreases, degrading the Q of the inductor.

Additionally, electrostatic discharge (ESD) is a phenomenon known to degrade or destroy discrete devices such as transistors, diodes, inductors, capacitors and resistors in integrated circuits. Both voltage and current spikes can break down the dielectric or doped regions in various portions of individual semiconductor devices, thus rending the entire device or even the entire chip completely or partially inoperable.

Capacitive loading becomes a major concern for integrated circuits running at radio frequencies (RF), i.e. greater than one GHz, as the capacitive loading of conventional ESD devices has an adverse effect on device performance. Conventional ESD devices are large area transistors or diodes fabricated in the semiconductor substrate of the integrated circuit. The capacitance looking into an integrated circuit is given by:

$$CTOT = CCKT + CESD \quad (1)$$

where: CTOT is the total capacitance of the device;
CCKT is the capacitance of the integrated circuit; and
CESD is the capacitance of the ESD protection device.

RF circuits are designed with low CCKT values, but ESD protection circuits and devices have relatively high CESD values and the value of CTOT can become dominated by the value of CESD. For example, at one GHz, a CTOT of one pF or less is acceptable. At 10 GHz, CTOT must be about 0.1 pF or less, which is difficult to achieve with conventional ESD protection circuits. At 100 GHz, CTOT must be about 0.01 pF or less, which is very difficult if possible to achieve with conventional ESD protection circuits. ESD protection elements are needed for both active and passive elements.

Field emission devices (FEDs) and spark gaps provide ESD protection with little or no added capacitance, but are difficult to implement on semiconductor chips and pose potential contamination and therefore reliability problems. For integrated circuits operating in the RF regime, a method of providing ESD protection is that does not create a reliability problem is needed.

Therefore, a solution is needed to the problem of providing high Q resistors, capacitors and inductors as CMOS scales smaller as well as a solution to the related problem of providing ESD protection for both the active and passive (especially high Q) elements of RF circuits.

SUMMARY OF THE INVENTION

A first aspect of the present invention is an electronic device comprising: a semiconductor chip including an integrated circuit having at least one electrostatic discharge sensitive device; and a non-semiconductor chip, positioned in close proximity to the semiconductor chip, the non-semiconductor chip having at least one electrostatic discharge protection device, the electrostatic discharge protection device electrically connected to the electrostatic discharge sensitive device.

A second aspect of the present invention is an electronic device comprising: a semiconductor chip including an integrated circuit; and a non-semiconductor chip, positioned in close proximity to the semiconductor chip, the non-semiconductor chip having at least one electrostatic discharge sensitive device and at least one electrostatic discharge protection device, the electrostatic discharge protection device electrically connected to the electrostatic discharge sensitive device.

A third aspect of the present invention is an electronic device comprising: a semiconductor chip including an integrated circuit having at least one first electrostatic discharge sensitive device; and a non-semiconductor chip, positioned in close proximity to the semiconductor chip, the non-semiconductor chip having at least one second electrostatic discharge sensitive device and at least one first electrostatic discharge protection device and at least one second electrostatic discharge protection device, the first electrostatic discharge protection device electrically connected to the first electrostatic discharge sensitive device and the second electrostatic discharge protection device electrically connected to the second electrostatic discharge sensitive device.

A fourth aspect of the present invention is an electronic device comprising: a dual chip stack comprising: a semiconductor chip including an integrated circuit having at least one electrostatic discharge sensitive device; and a non-semiconductor chip, attached to the semiconductor chip, the non-semiconductor chip having at least one electrostatic discharge protection device, the electrostatic discharge protection device electrically connected to the electrostatic discharge sensitive device.

A fifth aspect of the present invention is an electronic device comprising: a dual chip stack comprising: a semiconductor chip including an integrated circuit; and a non-semiconductor chip, attached to the semiconductor chip, the non-semiconductor chip having at least one electrostatic discharge sensitive device and at least one electrostatic discharge protection device, the electrostatic discharge protection device electrically connected to the electrostatic discharge sensitive device.

A sixth aspect of the present invention is an electronic device comprising: a dual chip stack comprising: a semiconductor chip including an integrated circuit having at least one first electrostatic discharge sensitive device; and a non-semiconductor chip, positioned in close proximity to the semiconductor chip, the non-semiconductor chip having at least one second electrostatic discharge sensitive device and at least one first electrostatic discharge protection device and at least one second electrostatic discharge protection device, the first electrostatic discharge protection device electrically connected to the first electrostatic discharge sensitive device and the second electrostatic discharge protection device electrically connected to the second electrostatic discharge sensitive device.

A seventh aspect of the present invention is an electronic device comprising: a dual chip stack mounted on a module, the dual chip stack comprising: a semiconductor chip including an integrated circuit having at least one electrostatic discharge sensitive device; and a non-semiconductor chip, attached to the semiconductor chip, the non-semiconductor chip having at least one electrostatic discharge protection device, the electrostatic discharge protection device electrically connected to the electrostatic discharge sensitive device.

An eighth aspect of the present invention is an electronic device comprising: a dual chip stack mounted on a module, the dual chip stack comprising: a semiconductor chip including an integrated circuit; and a non-semiconductor chip, attached to the semiconductor chip, the non-semiconductor chip having at least one electrostatic discharge sensitive device and at least one electrostatic discharge protection device, the electrostatic discharge protection device electrically connected to the electrostatic discharge sensitive device.

A ninth aspect of the present invention is an electronic device comprising: a dual chip stack mounted on a module, the dual chip stack comprising: a semiconductor chip including an integrated circuit having at least one first electrostatic discharge sensitive device; and a non-semiconductor chip, positioned in close proximity to the semiconductor chip, the non-semiconductor chip having at least one second electrostatic discharge sensitive device and at least one first electrostatic discharge protection device and at least one second electrostatic discharge protection device, the first electrostatic discharge protection device electrically connected to the first electrostatic discharge sensitive device and the second electrostatic discharge protection device electrically connected to the second electrostatic discharge sensitive device.

A tenth aspect of the present invention is a method of protecting an electrostatic discharge sensitive component from an electrostatic discharge event comprising: forming the electrostatic discharge sensitive device on a semiconductor chip; forming an electrostatic discharge protection device on a non-semiconductor chip; and electrically connecting the electrostatic discharge sensitive device to the electrostatic discharge protection device.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
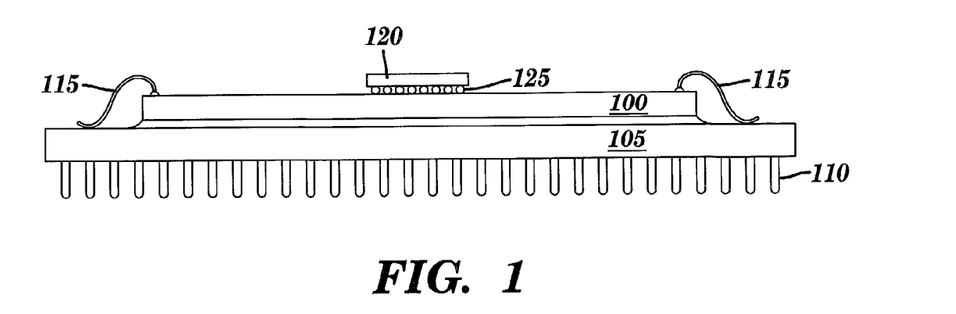
FIG. 1 is a side view of a first example of a dual chip stack according to the present invention.

FIG. 1 is a side view of a first example of a dual chip stack according to the present invention. In FIG. 1, an integrated circuit chip 100 comprising active semiconductor devices such as transistors and diodes and passive devices such as capacitors, resistors and inductors and circuits thereof, is mounted to a pin grid array (PGA) module 105 having a multiplicity of pins 110. At least a portion of the semiconductor devices contained within integrated circuit chip 100 are sensitive to ESD. The semiconductor devices and circuits contained in integrated circuit chip 100 are electrically connected to PGA module 105 and ultimately to pins 110 by a multiplicity of wirebonds 115. Mounted to integrated circuit chip 100 is a non-semiconductor chip 120 containing a multiplicity of electrostatic discharging devices. Non-semiconductor chip 120 may also contain passive devices such as capacitors, resistors and inductors. The electrostatic discharging devices and capacitors, resistors and inductors contained in non-semiconductor chip 120 are electrically connected to integrated circuit chip 100 by a multiplicity of solder balls 125 which also serve to attach the two chips.

Figure 2:
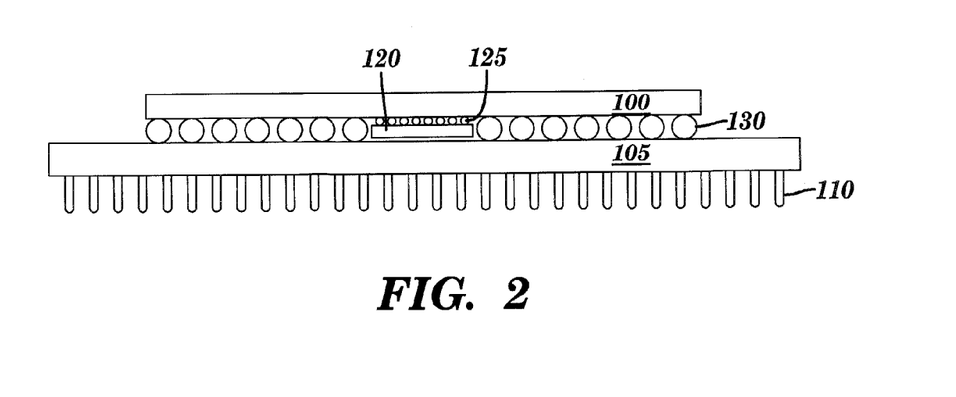
FIG. 2 is a side view of a second example of a dual chip stack according to the present invention.

FIG. 2 is a side view of a second example of a dual chip stack according to the present invention. In FIG. 2, integrated circuit chip 100 comprising active semiconductor devices such as transistors and diodes and passive devices such as capacitors, resistors and inductors and circuits thereof, is mounted to pin grid array (PGA) module 105. At least a portion of the semiconductor devices contained within integrated circuit chip 100 are sensitive to ESD. The semiconductor devices and circuits contained in integrated circuit chip 100 are electrically connected to PGA module 105 and ultimately to pins 110 by a multiplicity of solder balls 130. Mounted to integrated circuit chip 100 is non-semiconductor chip 120 containing a multiplicity of electrostatic discharging devices. Non-semiconductor chip 120 may also contain passive devices such as capacitors, resistors and inductors. The electrostatic discharging devices and capacitors, resistors and inductors contained in non-semiconductor chip 120 are electrically connected to integrated circuit chip 100 by solder balls 125 which also serve to attach the two chips.

Figure 3:
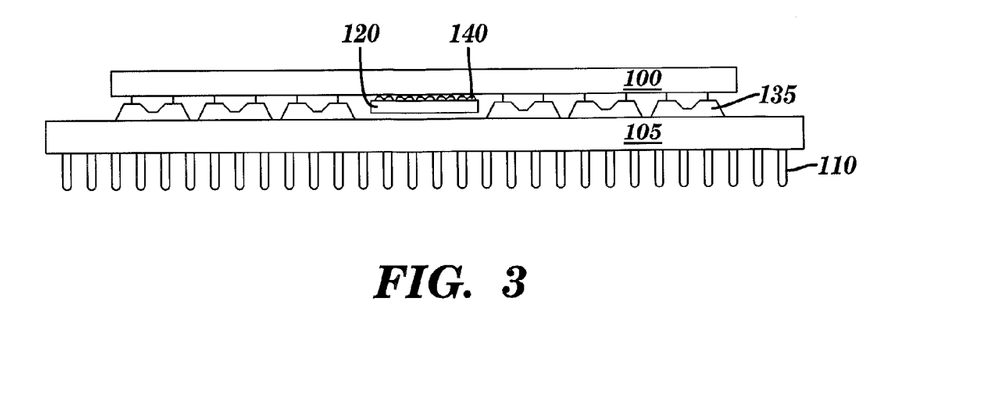
FIG. 3 is a side view of a third example of a dual chip stack according to the present invention.

FIG. 3 is a side view of a third example of a dual chip stack according to the present invention. In FIG. 3, integrated circuit chip 100 comprising active semiconductor devices such as transistors and diodes and passive devices such as capacitors, resistors and inductors and circuits thereof, is mounted to pin grid array (PGA) module 105. At least a portion of the semiconductor devices contained within integrated circuit chip 100 are sensitive to ESD. The semiconductor devices and circuits contained in integrated circuit chip 100 are electrically connected to PGA module 105 and ultimately to pins 110 by a multiplicity of low capacitance RF bumps 135. Mounted to integrated circuit chip 100 is non-semiconductor chip 120 containing a multiplicity of electrostatic discharging devices. Non-semiconductor chip 120 may also contain passive devices such as capacitors, resistors and inductors. The electrostatic discharging devices and capacitors, resistors and inductors contained in non-semiconductor chip 120 are electrically connected to integrated circuit chip 100 by low capacitance RF bumps 140 which also serve to attach the two chips.

The electrostatic discharging devices contained in non-semiconductor device 120 (and discussed in reference to FIGS. 1, 2 and 3 above) include spark gaps, field emission devices, diodes and gated diodes. The difference between a spark gap and a field emission device is spark gaps generally discharges across an air gap, while a field emission device can discharge across a gap in air, other gas, or a solid such as an insulator. Spark gaps, field emission devices, diodes and gated diodes. and may be used to provide ESD protection for the transistors, diodes, capacitors, resistors and inductors contained in integrated circuit chip 100 as well as the capacitors, resistors and inductors contained in non-semiconductor chip 120. Integrated circuit chip 100 may comprise a silicon, a silicon on insulator (SOI) or a gallium arsenide substrate. The active devices contained with integrated circuit chip may be fabricated in complementary metal oxide silicon (CMOS), RF CMOS, Bipolar, BiCMOS, SiGe Bipolar, silicon-germanium-carbon (SiGeC) and SiGe BiCMOS technologies. In one example, non-semiconductor chip 120 is quartz.

Other types of modules may be used in conjunction with the present invention, including but not limited to ball grid arrays (BGA), surface mount technology (SMT) modules such as small outline packages (SOP), and quad flat packages (QFP) leaderless chip carrier (LCC), tape automated bonded (TAB) modules and other pin type packages. In the case of TAB modules attachment of semiconductor chip 100 to the module is necessarily by bumps and beam leads.

Figure 4:
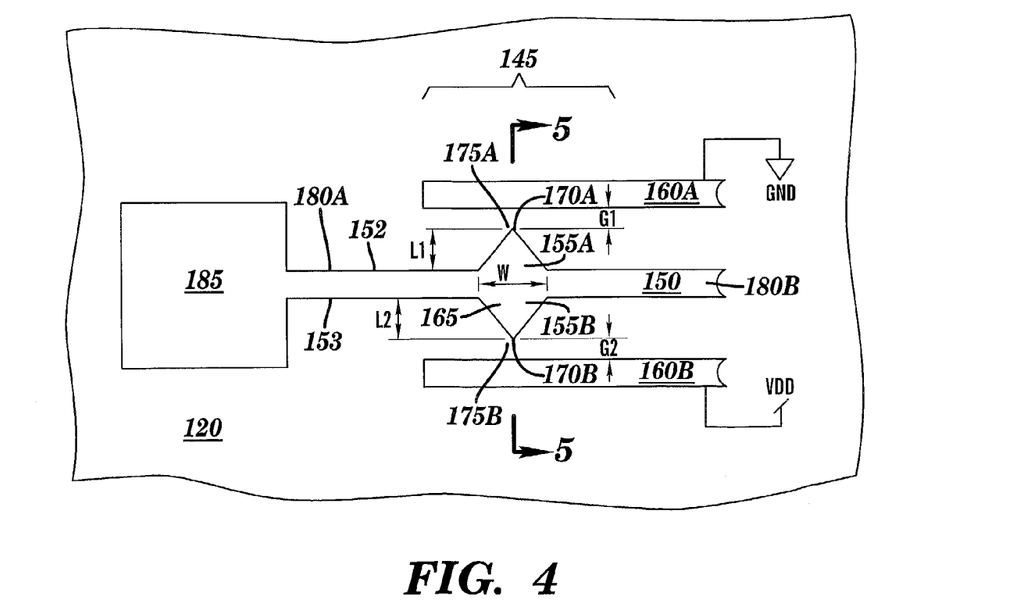
FIG. 4 is top view of a spark gap electrostatic discharge protection device according to a first embodiment of the present invention.

FIG. 4 is top view of a spark gap electrostatic discharge protection device according to a first embodiment of the present invention. In FIG. 4, an ESD protection device 145 is formed on non-semiconductor substrate 120. ESD protection device 145 comprises a central conductive line 150 having first extending member 155A extending a distance "L1" from a first side 152 of the central conductive line toward a first outer conductive line 160A from a middle portion 165 of the central conductive line. ESD protection device 145 further comprises a second extending member 155B extending from a second side 153, opposite first side 152, of the central conductive line a distance "L2" toward a second outer conductive line 160B. Middle portion 165 is "W" wide. First extending portion 155A tapers to a first tip 170A. First tip 170A is separated from first outer conductive line 160A by a first gap 175A. Second extending portion 155B tapers to a second tip 170B. Second tip 170B is separated from second outer conductive line 160B by a second gap 175B. First gap 175A is "G1" wide and second gap 175B is "G2" wide. A first end 180A of central conductive line 150 is electrically connected to a pad 185 for receiving I/O or other signals. A second end 180B of central conductive line 150 is electrically connected to a circuit or device to be protected. The circuit or device to be protected may reside on non-semiconductor chip 120 or semiconductor chip 100. First outer conductive line 160A is electrically tied to ground (GND) while second outer conductive line 160B is electrically tied to VDD.

An ESD event occurring on pad 185 will generate a field at either first tip 170A or second tip 170B sufficient to create a current path to either first outer conductive line 160A or second outer conductive line 160B, shunting the ESD event to either outer conductive line and thus preventing the ESD event from propagating to the circuit or device electrically connected to second end 180B of central conductive line 150.

Pad 185 and ESD protection device 145 may be integrally formed by in the same conductive layer during fabrication of non-semiconductor chip 120. In one example, ESD protection device 145 is formed from aluminum, aluminum/copper, aluminum/copper/silicon, aluminum/titanium/titanium nitride, copper, copper/tantalum/tantalum nitride or tungsten about 1.0 to 6.0 microns thick. "W" is about 1.0 to 3.0 microns, "L1" and "L2" are 0.5 to 2.0 microns but not necessarily equal and "G1" and "G2" are about 0.5 to 2.0 microns but not necessarily equal. Spark gaps and FEDs fabricated with these values of "W", "L1", "L2", "G1" and "G2" will provide ESD protection for frequencies of about 1.0 to 100 GHz.

Figure 5A:
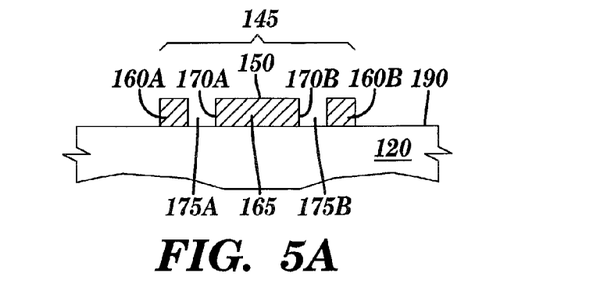
FIGS. 5A through 5D are a partial cross-section views through 5—5 of FIG. 4 illustrating fabrication options of the spark gap/FED electrostatic discharge protection device.

FIGS. 5A through 5D are a partial cross-section views through 5—5 of FIG. 4 illustrating fabrication options of the spark gap/FED electrostatic discharge protection device. In FIG. 5A, electrostatic discharge device 145 is fabricated on a top surface 190 of non-semiconductor chip 120 by, for example, a subtractive etch process.

Figure 5B:
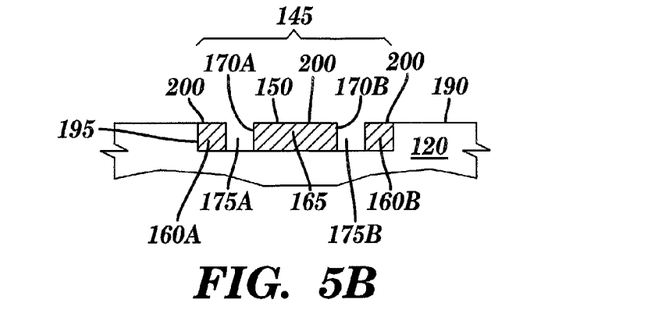

In FIG. 5B, electrostatic discharge device 145 is fabricated in a trench 195 formed in non-semiconductor chip 120 by, for example, a damascene process. A top surface 200 of electrostatic discharge device 145 is co-planer with top surface 190 of non-semiconductor chip 120.

Figure 5C:
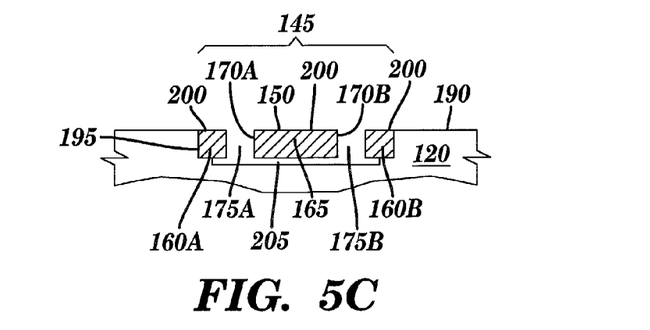

In FIG. 5C, an etch step has been performed on the structure illustrated in FIG. 5B to form a air gap under middle portion 165 of central conductive line 150 and from under a portion of first and second outer conductive lines 160A and 160B in the vicinity of gaps 175A and 175B.

Figure 5D:
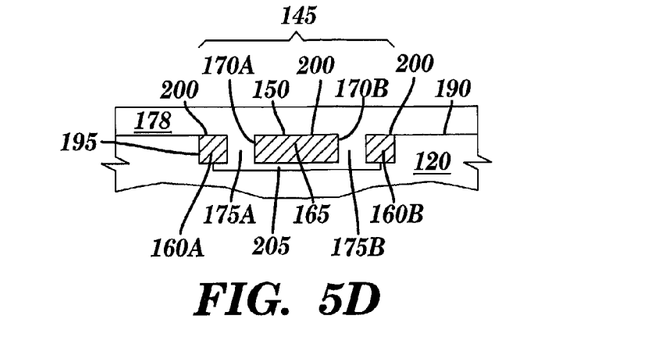

In FIG. 5D, an insulating layer 178 has been formed on top surfaces 190 and 200 filling gaps 175A and 175B to form a field emission device.

Figure 6A:
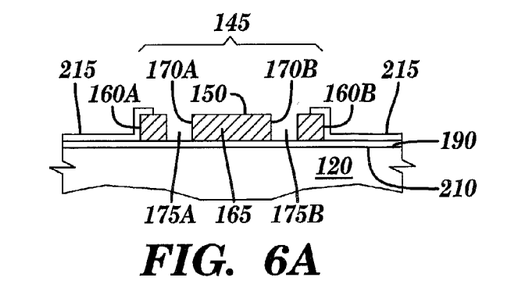
FIGS. 6A through 6D are a partial cross-section views of the devices illustrated in FIGS. 5A through 5D further illustrating fabrication options of the spark gap/FED electrostatic discharge protection device and including optional dielectric and passivation layers.

FIGS. 6A through 6D are a partial cross-section views of the devices of FIGS. 5A through 5D illustrating fabrication options of the spark gap/FED electrostatic discharge protection device and including optional dielectric and passivation layers. In FIG. 6A, electrostatic discharge device 145 is fabricated on top of an optional dielectric layer 210 formed on top surface 190 of non-semiconductor chip 120. An optional passivation layer 215 is formed on top of central conductive line 150 and first and second outer conductive lines 160A and 160B except near gaps 175A and 175B.

Figure 6B:
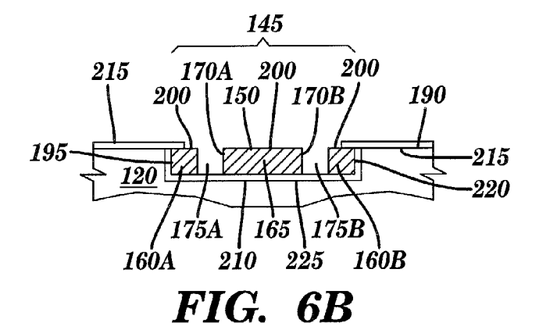

In FIG. 6B, electrostatic discharge device 145 is fabricated over dielectric layer 215 formed on sidewalls 220 and bottom 225 of trench 195. Optional passivation layer 215 is formed on top of central conductive line 150 and first and second outer conductive lines 160A and 160B except near gaps 175A and 175B.

Figure 6C:
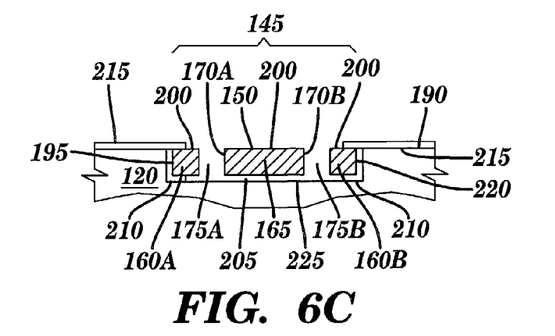

In FIG. 6C, an etch step to has been performed, removing a portion of dielectric layer 210 from the structure illustrated in FIG. 6B to form a air gap under middle portion 165 of central conductive line 150 and from under a portion of first and second outer conductive lines 160A and 160B near gaps 175A and 175B. Optional passivation layer 215 is formed on top of central conductive line 150 and first and second outer conductive lines 160A and 160B except near gaps 175A and 175B.

Dielectric layer 210 may be used to reduce surface leakage otherwise present if central conductive line 150 and inner and outer conductive line are fabricated directly on top surface 190 of non-semiconductor chip 120. In one example, dielectric layer 210 is silicon oxide, silicon nitride or layers thereof.

Figure 6D:
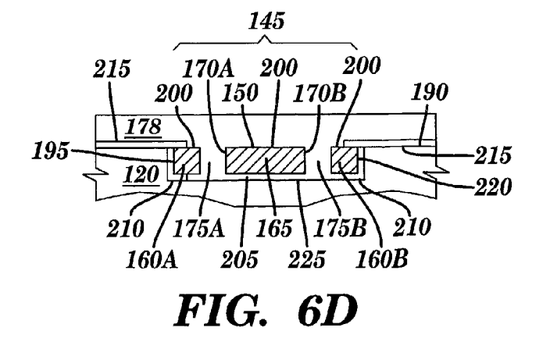

In FIG. 6D, an insulating layer 178 has been formed on top surfaces 190 and 200 filling gaps 175A and 175B to form a field emission device.

Figure 7:
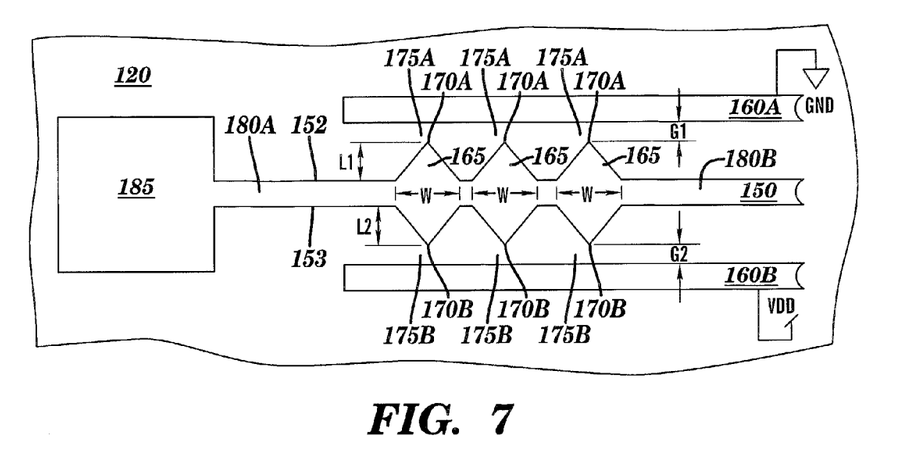
FIG. 7 is top view of a spark gap/FED electrostatic discharge protection device according to a second embodiment of the present invention.

FIG. 7 is top view of a spark gap/FED electrostatic discharge protection device according to a second embodiment of the present invention. The only difference between the second embodiment and the first embodiment is that in the second embodiment there are a multiplicity of first tips 170A and a multiplicity of second tips 170B extending from first and second sides 152 and 153 of central conductive line 150 and there are a multiplicity of first and seconds gaps 175A and 175B. Not all of first gaps 170A need be the same width nor all of second gaps 170B need be the same width.

Figure 8:
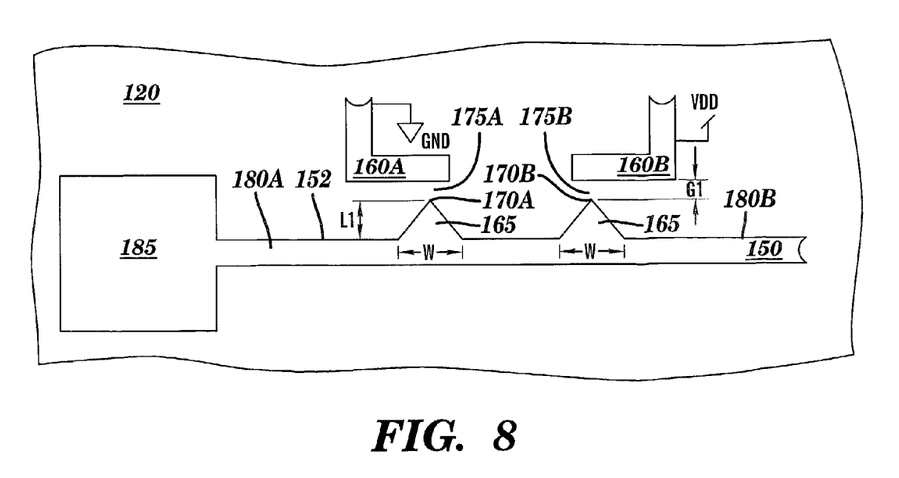
FIG. 8 is top view of a spark gap/FED electrostatic discharge protection device according to a third embodiment of the present invention.

FIG. 8 is top view of a spark gap/FED electrostatic discharge protection device according to a third embodiment of the present invention. The only difference between the third embodiment and the first embodiment is that in the third embodiment, both first tip 175A and second tip 175B are on first side 152 of central conductive line 150. Of course, first outer conductive line 160A and second outer conductive line 160B must be positioned on the same side of central conductive line 150.

Figure 9:
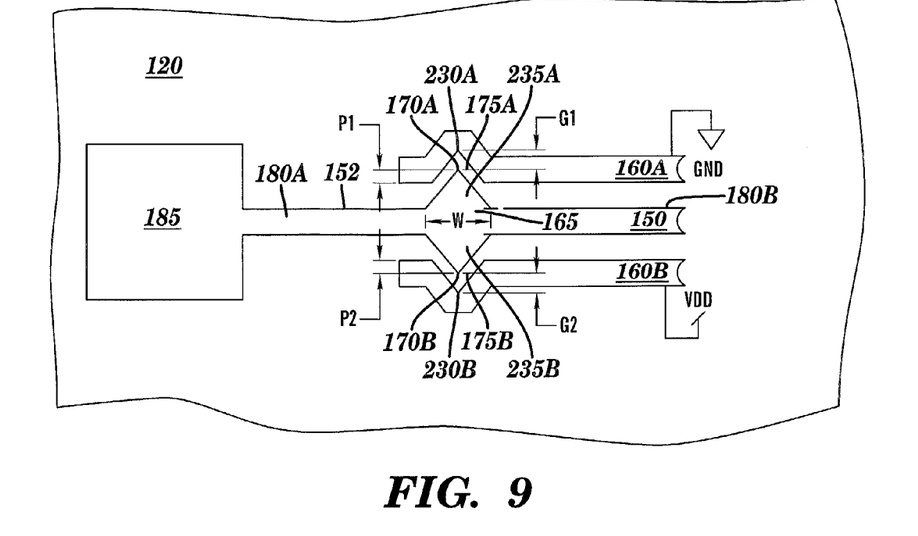
FIG. 9 is top view of a spark gap electrostatic discharge protection device according to a fourth embodiment of the present invention.

FIG. 9 is top view of a spark gap/FED electrostatic discharge protection device according to a fourth embodiment of the present invention. The only difference between the fourth embodiment and the first embodiment is that in the fourth embodiment the first and second outer conductive lines 160A and 160B have pointed first and second concavities 230A and 230B respectively, into which first and second end portions 235A and 235B of middle portion 165 of central conductive line 150 respectively extend into. First end portion 235A extends into first concavity 230A a distance "P1." Second end portion 235B extends into second concavity 230B a distance "P2." "P1" need not be equal to "P2." In one example, "W" is about 1.0 to 3.0 microns, "P1" is about 0.5 to 2.0 microns and "P2" is about 0.5 to 2.0 microns and "G1" is about 0.5 to 2.0 microns and "G2" is about 0.5 to 2.0 microns. Spark gaps fabricated with these values of "W", "P1", "P2", "G1" and "G2" will provide ESD protection for frequencies of about 1.0 to 100 GHz.

While diodes may not be suitable for high frequency protection, their inclusion on non-semiconductor chip 120 is useful for protection of lower frequency circuits that may be present in semiconductor chip 100.

Figure 10:
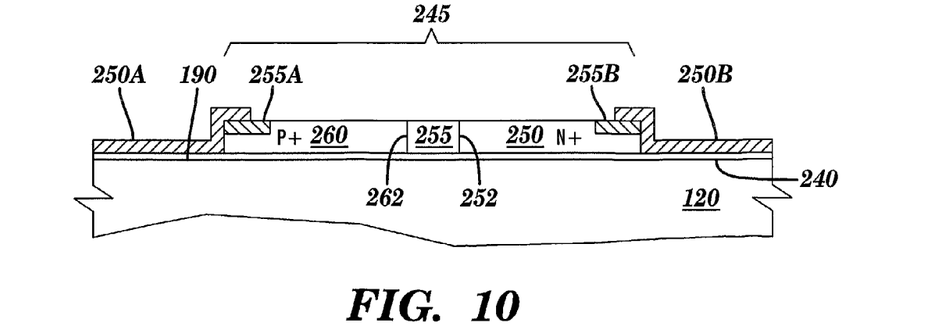
FIG. 10 is a partial cross-sectional view of a diode electrostatic discharge device protection device according to a fifth embodiment the present invention.

FIG. 10 is a partial cross-sectional view of a diode electrostatic discharge device protection device according to a fifth embodiment of the present invention. In FIG. 10, a dielectric layer 240 is formed on top surface 190 of non-semiconductor chip 120. A polysilicon diode 245 has been formed on top of dielectric layer 240. Diode 245 comprises an N+ region 250 formed on a first side 252 of an intrinsic region 255 and a P+ region 260 formed on a second side 262 of the intrinsic region. In one example, N region 250 is doped to a concentration of about 1020 atom/cm3 and P region 260 is doped to a concentration of about 1020 atom/cm3. Dielectric layer 240 improves leakage characteristics of diode 245 and allows a higher quality polysilicon to be formed. A first conductive wire 250A is electrically connected to P region 260 by a first silicide region 255A. A second conductive wire 250B is electrically connected to N+ region 250 by a second suicide region 255B.

Figure 11:
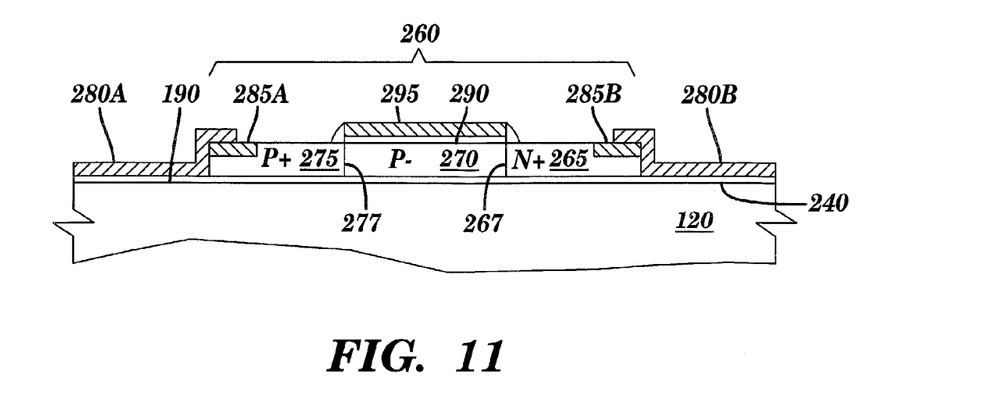
FIG. 11 is a partial cross-sectional view of a gated diode electrostatic discharge device protection device according to a sixth embodiment of the present invention.

FIG. 11 is a partial cross-sectional view of a gated diode electrostatic discharge device protection device according a sixth embodiment of the present invention. In FIG. 11, dielectric layer 240 is formed on top surface 190 of non-semiconductor chip 120. A gated polysilicon diode 260 has been formed on top of dielectric layer 240. Gated diode 260 comprises an N+ region 265 formed on a first side 267 of a PÌ . . . region 270 and a P+ region 275 formed on a second side 277 of the PÌ . . . region. In one example, N+ region 265 is doped to a concentration of about 1020 atom/cm3, P+ region 275 is doped to a concentration of about 1020 atom/cm3 and PÌ . . . region 270 is doped to a concentration of about 1016 atom/cm3. Dielectric layer 240 improves leakage characteristics of gated diode 260 and allows a higher quality polysilicon to be formed. A first conductive wire 280A is electrically connected to P+ region 275 by a first silicide region 285A. A second conductive wire 280B is electrically connected to N+ region 265 by a second silicide region 285B. Formed over PÌ . . . region 270 is a gate dielectric 290 and formed on the gate dielectric is a gate conductor 295.

Figure 12:
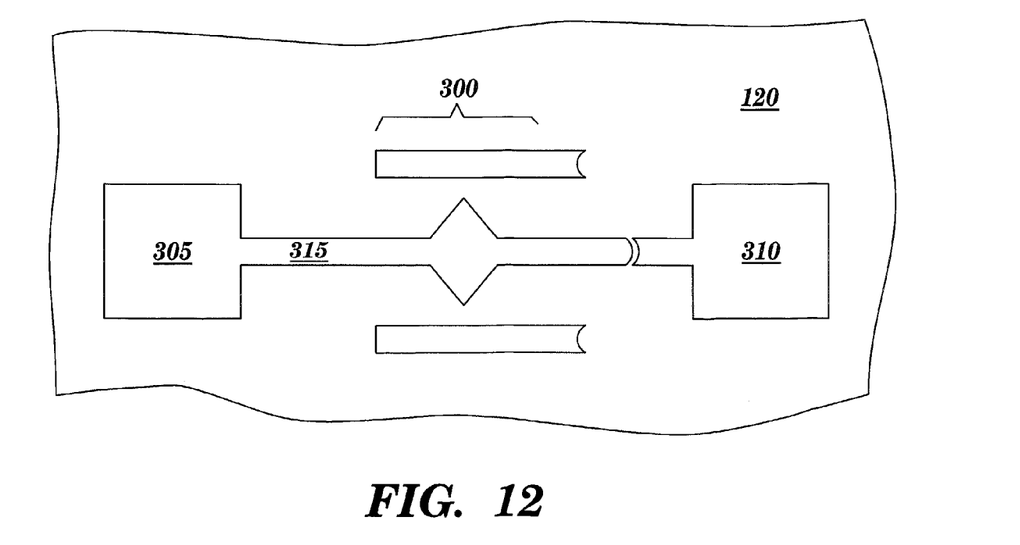
FIG. 12 is a top view illustrating a spark gap ESD protection device protecting a wiring pad according to the present invention.

FIG. 12 is a top view illustrating a spark gap ESD protection device protecting a wiring pad according to the present invention. In FIG. 12, on non-semiconductor chip 120, an ESD protection device 300 is a spark gap protection device and is connected between an I/O pad 305 and an inter-chip pad 310 by a central conductive line 315 of the ESD protection device. In the present example, pads 305 and 310 are integral with central conductive line 315. Inter-chip pad 310 is used to electrically connect ESD protection device 300 contained on non-semiconductor chip 120 to active or passive devices contained in semiconductor chip 100 in order to protect those devices from ESD events. In one example, ESD protection device 300 and pads 305 and 310 are formed from aluminum, aluminum/copper, aluminum/copper/silicon, aluminum/titanium/titanium nitride, copper, copper/tantalum/tantalum nitride or tungsten about 1.0 to 6.0 microns thick.

Figure 13:
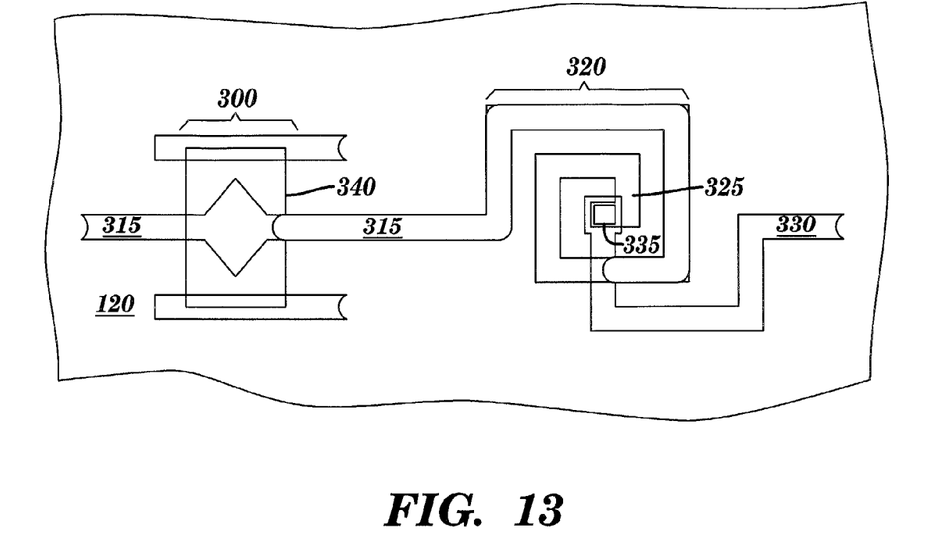
FIG. 13 is a top view illustrating a spark gap ESD protection device protecting an inductor according to the present invention.

FIG. 13 is a top view illustrating a spark gap ESD protection device protecting an inductor according to the present invention. In FIG. 13, on non-semiconductor chip 120, an ESD protection device 300 is a spark gap protection device and is connected to an inductor 320 by central conductive line 315 of the ESD protection device. Inductor 320 is comprised of a planer coil 325 and a tap 330. In the present example, coil 325 is integral with central conductive line 315 and formed in a first level of wiring. Tap 330 is formed in a second wiring level separated from the first wiring level by an interlevel dielectric and connected to coil 325 by via 335. An optional window 340 is formed in the interlevel dielectric layer to provide an air gap spark gap.

Inductor 320 and ESD protection device 300 may be connected to circuits contained in semiconductor chip 100 in order to provide those circuits with high Q inductors that are also protected from ESD events. The inductor is a High Q inductor because an inductor built on non-semiconductor chip 120 can have lower parasitic capacitance and resistance compared to one built on semiconductor chip 100 and provided with conventional ESD protection.

In one example, ESD protection device 300 and inductor 320 (including tap 330) are formed from aluminum, aluminum/copper, aluminum/copper/silicon, aluminum/titanium/titanium nitride, copper, copper/tantalum/tantalum nitride or tungsten about 1.0 to 6.0 microns thick.

Figure 14:
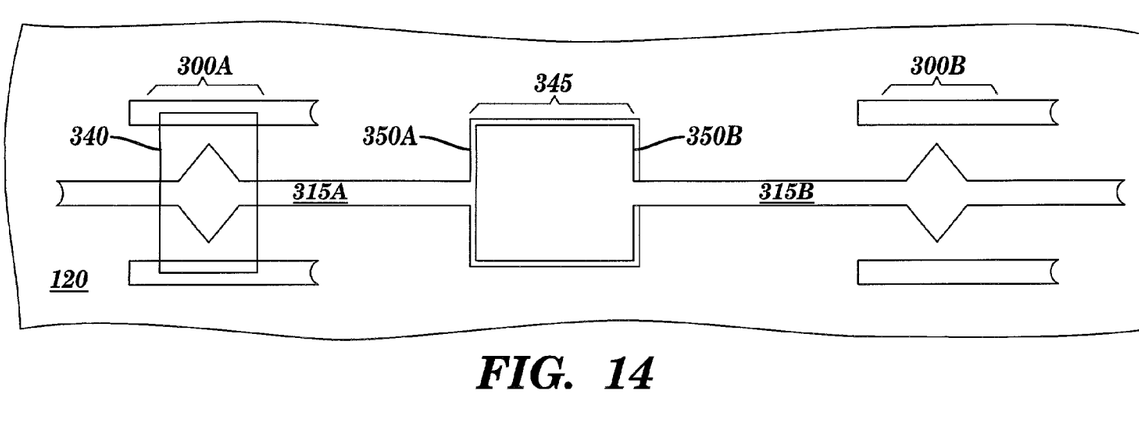
FIG. 14 is a top view illustrating park gap ESD protection devices protecting a capacitor according to the present invention.

FIG. 14 is a top view illustrating spark gap ESD protection devices protecting a capacitor according to the present invention. In FIG. 14, on non-semiconductor chip 120, a pair of ESD protection devices 300 (each being a spark gap protection device) are connected to opposite plates of capacitor 345 by the central conductive line of the each of the ESD protection devices. A lower plate 350A of capacitor 345 is connected to first ESD protection device 300A by central conductive line 315A of the first ESD protection device. First ESD protection device 300A and lower plate 350A are integrally formed in a first wiring level. An upper plate 350B of capacitor 345 is connected to second ESD protection device 300B by central conductive line 315B of the second ESD protection device. Second ESD protection device 300B and upper plate 350B are integrally formed in a second wiring level. The first and second wiring levels are separated by an interlevel dielectric layer. An optional window 340 is formed in the interlevel dielectric layer to provide an air gap spark gap. Capacitor 345 and first and second ESD protection devices 300A and 300B may be connected to circuits contained in semiconductor chip 100 in order to provide those circuits with high Q capacitors that are also protected from ESD events. Capacitor 345 is a high Q capacitor because first and second ESD protection devices 300A and 300B do not reduce the Q of the capacitor.

In one example, first and second ESD protection devices 300A and 300B and first and second plates 350A and 350B are formed from aluminum, aluminum/copper, aluminum/copper/silicon, aluminum/titanium/titanium nitride, copper, copper/tantalum/tantalum nitride or tungsten about 1.0 to 6.0 microns thick and the interlevel dielectric is formed from silicon oxide, silicon nitride or layers thereof.

Figure 15:
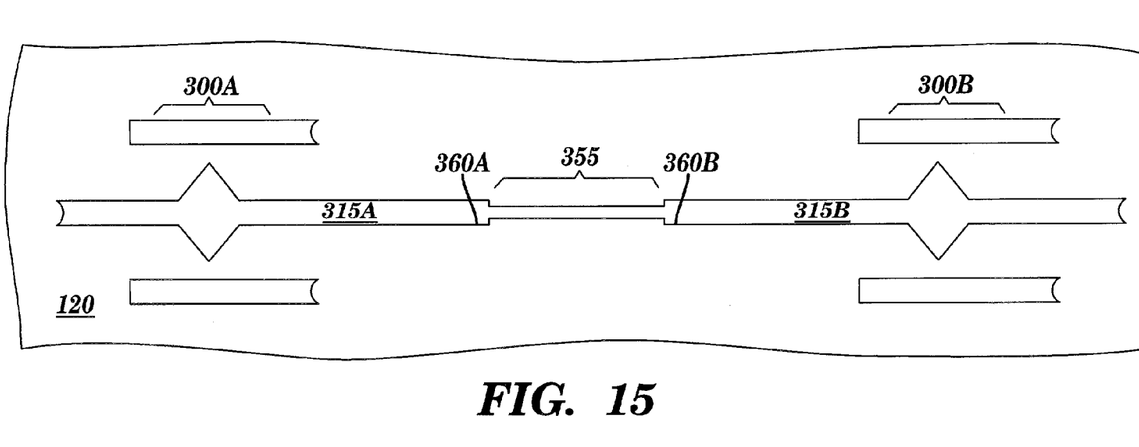
FIG. 15 is a top view illustrating spark gap ESD protection devices protecting a thin film resistor according to the present invention.

FIG. 15 is a top view illustrating spark gap ESD protection devices protecting a thin film resistor according to the present invention. In FIG. 15, on non-semiconductor chip 120, a pair of ESD protection devices 300 (each being a spark gap protection device) are connected to opposite ends of resistor 355 by the central conductive line of the each of the ESD protection devices. A first end 360A of resistor 355 is connected to first ESD protection device 300A by central conductive line 315A of the first ESD protection device. A second end 355B of resistor 355 is connected to second ESD protection device 300B by central conductive line 315B of the second ESD protection device. First and second ESD protection devices 300A, 300B, and resistor 355 are integrally formed in the same wiring level. In actuality, first and second central conductive lines 315A and 315B are one continuous conductive wire and resistor 355 is a narrow region of that continuous wire. Resistor 355 and first and second ESD protection devices 300A and 300B may be connected to circuits contained in semiconductor chip 100 in order to provide those circuits with high Q resistors that are also protected from ESD events. Resistor 355 is a high Q resistor because first and second ESD protection devices 300A and 300B do not reduce the Q of the resistor.

In one example, first and second ESD protection devices 300A and 300B and thin film resistor 355 are formed from aluminum, aluminum/copper, aluminum/copper/silicon, aluminum/titanium/titanium nitride, copper, copper/tantalum/tantalum nitride or tungsten about 1.0 to 6.0 microns.

While a spark gap/FED, and particularly the spark gap/FED device of the first embodiment has been illustrated in FIGS. 12 through 15 and described above, any of the spark gap/FED or diode ESD protection device embodiments described in FIGS. 4 through 12 and described above may be substituted. Further, a high quality dielectric such as silicon oxide, silicon nitride or layers thereof may be provided on top surface 190 of non-semiconductor chip 120 to reduce leakage of the protect devices, inductors, capacitors and resistors.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An electronic device comprising:
   a semiconductor chip including an integrated circuit having at least one electrostatic discharge sensitive device; and
   a non-semiconductor chip having a substrate formed of an electrically insulating material, positioned in close proximity to said semiconductor chip, said non-semiconductor chip having at least one electrostatic discharge protection device formed on said substrate, said electrostatic discharge protection device electrically connected to said electrostatic discharge sensitive device.

2. The electronic device of claim 1, wherein said electrostatic discharge sensitive device is selected from the group consisting of transistors, diodes, resistors, capacitors, and inductors.

3. The electronic device of claim 1, wherein said electrostatic discharge protection device is selected from the group consisting of spark gaps, field emission devices diodes and gated diodes.

4. An electronic device comprising:
   a semiconductor chip including an integrated circuit; and
   a non-semiconductor chip having a substrate formed of an electrically insulating material, positioned in close proximity to said semiconductor chip, said non-semiconductor chip having at least one electrostatic discharge sensitive device formed on said substrate and at least one electrostatic discharge protection device, said electrostatic discharge protection device electrically connected to said electrostatic discharge sensitive device.

5. The electronic device of claim 4, wherein said electrostatic discharge sensitive device is selected from the group consisting of resistors, capacitors and inductors.

6. The electronic device of claim 4, wherein said electrostatic discharge protection device is selected from the group consisting of spark gaps, field emission devices, diodes and gated diodes.

7. The electronic device of claim 4, wherein:
said electrostatic discharge sensitive device is selected from the group consisting of resistors, capacitors and inductors;
said electrostatic discharge protection device is a spark gap; and
said spark gap and at least a portion of said electrostatic discharge sensitive device and are integrally formed.

8. An electronic device comprising:
a semiconductor chip including an integrated circuit having at least one first electrostatic discharge sensitive device; and
a non-semiconductor chip having a substrate formed of an electrically insulating material, positioned in close proximity to said semiconductor chip, said non-semiconductor chip having at least one second electrostatic discharge sensitive device and at least one first electrostatic discharge protection device and at least one second electrostatic discharge protection device formed on said substrate, said first electrostatic discharge protection device electrically connected to said first electrostatic discharge sensitive device and said second electrostatic discharge protection device electrically connected to said second electrostatic discharge sensitive device.

9. The electronic device of claim 8, wherein:
said first electrostatic discharge sensitive device is selected from the group consisting of transistors, diodes, resistors, capacitors, and inductors; and
said second electrostatic discharge sensitive device is selected from the group consisting of resistors, capacitors, and inductors.

10. The electronic device of claim 8, wherein said first and second electrostatic discharge protection devices is selected from the group consisting of spark gaps, field emission devices, diodes and gated diodes.

11. The electronic device of claim 8, wherein:
said first electrostatic discharge sensitive device is selected from the group consisting of transistors, diodes, resistors, capacitors, and inductors;
said first electrostatic discharge protection devices is selected from the group consisting of spark gaps, field emission devices, diodes and gated diodes;
said second electrostatic discharge sensitive device is selected from the group consisting of capacitors, resistors and inductors;
said second electrostatic discharge protection device is a spark gap or a field emission device; and
said spark gap, or field emission device, and at least a portion of said second electrostatic discharge sensitive device are integrally formed.

12. An electronic device comprising:
a dual chip stack comprising:
a semiconductor chip including an integrated circuit having at least one electrostatic discharge sensitive device; and
a non-semiconductor chip having a substrate formed of an electrically insulating material, attached to said semiconductor chip, said non-semiconductor chip having at least one electrostatic discharge protection device formed on said substrate, said electrostatic discharge protection device electrically connected to said electrostatic discharge sensitive device.

13. An electronic device comprising:
a dual chip stack comprising:
a semiconductor chip including an integrated circuit; and
a non-semiconductor chip having a substrate formed of an electrically insulating material, attached to said semiconductor chip, said non-semiconductor chip having at least one electrostatic discharge sensitive device and at least one electrostatic discharge protection device formed on said substrate, said electrostatic discharge protection device electrically connected to said electrostatic discharge sensitive device.

14. An electronic device comprising:
a dual chip stack comprising:
a semiconductor chip including an integrated circuit having at least one first electrostatic discharge sensitive device; and
a non-semiconductor chip formed of an electrically insulating material, positioned in close proximity to said semiconductor chip, said non-semiconductor chip having at least one second electrostatic discharge sensitive device and at least one first electrostatic discharge protection device and at least one second electrostatic discharge protection device, said first electrostatic discharge protection device electrically connected to said first electrostatic discharge sensitive device and said second electrostatic discharge protection device electrically connected to said second electrostatic discharge sensitive device.

15. An electronic device comprising:
a dual chip stack mounted on a module, said dual chip stack comprising:
a semiconductor chip including an integrated circuit having at least one electrostatic discharge sensitive device; and
a non-semiconductor chip having a substrate formed of an electrically insulating material, attached to said semiconductor chip, said non-semiconductor chip having at least one electrostatic discharge protection device formed on said substrate, said electrostatic discharge protection device electrically connected to said electrostatic discharge sensitive device.

16. An electronic device comprising:
a dual chip stack mounted on a module, said dual chip stack comprising:
a semiconductor chip including an integrated circuit; and
a non-semiconductor chip having a substrate formed of an electrically insulating material, attached to said semiconductor chip, said non-semiconductor chip having at least one electrostatic discharge sensitive device and at least one electrostatic discharge protection device formed on said substrate, said electrostatic discharge protection device electrically connected to said electrostatic discharge sensitive device.

17. An electronic device comprising:
   an integrated circuit chip comprising a semiconductor substrate and an integrated circuit, said integrated circuit having an electrostatic discharge sensitive device; and
   an electrostatic discharge protection chip comprising a non-semiconductor substrate and an electrostatic discharge protection device, said electrostatic discharge protection chip positioned in close proximity to said integrated circuit chip, said electrostatic discharge protection device electrically and directly connected by only metal conductors to said electrostatic discharge sensitive device or only metal conductors and semiconductor devices of said integrated circuit chip.

18. The device of claim 17, wherein said electrostatic discharge protection device is electrically and directly connected to said electrostatic discharge sensitive device through a first I/O pad on said integrated circuit chip, a solder bump and a second I/O pad on said electrostatic discharge protection chip, said solder bump in direct physical contact with said first and second I/O pads.

19. The device of claim 17, wherein said electrostatic discharge protection device is a polysilicon diode.

20. The device of claim 17, wherein said electrostatic discharge protection device is a spark gap.

21. The device of claim 17, wherein said electrostatic discharge protection device is a field emission device.

22. The device of claim 17, wherein said non-semiconductor substrate is a quartz substrate.

23. The device of claim 17, wherein said electrostatic discharge sensitive device is a semiconductor transistor.

24. The device of claim 17, wherein said electrostatic discharge sensitive device is a semiconductor diode.

25. The device of claim 17, wherein said electrostatic discharge protection device comprises:
   a first electrically conductive wire directly connected to an I/O pad of said electrostatic discharge protection chip, said first electrically conductive wire having first and second members extending train opposite sides of said first electrically conductive wire, both members terminating in points;
   a second electrically conductive wire separated from said point of said first member by a first gap; and
   a third electrically conductive wire separated from said point of said second member by a second gap.

26. The device of claim 25, wherein said gap is filled with a gaseous insulating material.

27. The device of claim 25, wherein said gap is filled with an solid insulating material.

28. The device of claim 25, wherein said second electrically conductive wire is connected to a low voltage terminal of a power supply and said third electrically conductive wire is connected to a high voltage terminal of said power supply.

29. The device of claim 17, wherein said electrostatic discharge protection device comprises:
   a first electrically conductive wire directly connected to an I/O pad of said electrostatic discharge protection chip, said first electrically conductive wire having first and second members extending from the same side of said first electrically conductive wire, both members terminating in points;
   a second electrically conductive wire separated from said point of said first member by a first gap; and
   a third electrically conductive wire separated from said point of said second member by a second gap,
   said second and third electrically conductive wires separated from one another by a third gap.

30. The device of claim 29, wherein said second electrically conductive wire is connected to a low voltage terminal of a power supply and said third electrically conductive wire is connected to a high voltage terminal of said power supply.

31. The device of claim 29, wherein said gap is filled with a gaseous insulating material.

32. The device of claim 29, wherein said gap is filled with an solid insulating material.

33. The device of claim 29, wherein said second electrically conductive wire is connected to a low voltage terminal of a power supply and said third electrically conductive wire is connected to a high voltage terminal of said power supply.

* * * * *